United States Patent [19]
Hasegawa et al.

[11] Patent Number: 5,676,758
[45] Date of Patent: Oct. 14, 1997

[54] CVD APPARATUS

[75] Inventors: Shinya Hasegawa, Tokyo; Shigeru Mizuno; Kazuhito Watanabe, both of Kanagawaken-ken; Nobuyuki Takahashi, Tokyo; Manabu Tagami, Tokyo; Takanori Yoshimura, Tokyo; Hajime Sahase, Tokyo, all of Japan

[73] Assignee: Anelva Corporation, Fuchu, Japan

[21] Appl. No.: 635,492

[22] Filed: Apr. 22, 1996

[30] Foreign Application Priority Data

Aug. 6, 1995 [JP] Japan .................. 7-166955

[51] Int. Cl.$^6$ .................................. C23C 16/00
[52] U.S. Cl. ........................ 118/173 E; 118/723 ER
[58] Field of Search .................. 118/723 E, 723 ER, 118/723 I, 723 IR, 723 MP; 156/345; 216/70, 68, 71; 204/298.07, 298.33

[56] References Cited

U.S. PATENT DOCUMENTS 4,482,419  11/1984  Tsukada et al. ............... 156/345
5,230,741  7/1993   van de Ven et al. ........... 118/728
5,374,594  12/1994  van de Ven et al. ........... 437/247

FOREIGN PATENT DOCUMENTS 4-345022  12/1992  Japan .

*Primary Examiner*—John Niebling
*Assistant Examiner*—Joni V. Chang
*Attorney, Agent, or Firm*—Burns, Doane, Swecker & Mathis, LLP

[57] ABSTRACT

A CVD mechanism includes a reactor, a substrate holder, a heating apparatus for heating the substrate holder, a reaction gas supply plate for supplying reaction gas into the reactor, and at least two cylinders disposed in a concentric form on the substrate-facing surface of the reaction gas supply plate so that reaction gas is supplied from an inward portion of each cylinder in the reaction gas supply plate. A power supply mechanism for supplying power to the reaction gas supply plate and the substrate holder, and ring magnets disposed in the upper and lower portions of the reactor are provided so that magnetic lines of force passing through a plasma space are generated by the facing magnetic pole parts of the respective magnets.

12 Claims, 4 Drawing Sheets

CVD APPARATUS

BACKGROUND OF THE INVENTION

1. Field of the Invention

The present invention relates to a chemical vapor deposition (CVD) apparatus for depositing thin films by CVD reaction in a semiconductor device manufacturing process.

2. Description of the Related Art

In recent years semiconductor devices have become increasingly integrated and smaller. Making smaller semiconductor devices requires, for example, sufficient filling of a film into a very small hole or new manufacturing technology that prevents wire disconnection due to heat generation or electromigration caused by high current density. In the film deposition step for a Ti or TiN film, which is an underlying film for wiring materials, such as aluminum (Al), tungsten (W) or copper (Cu), manufacturing technology using the CVD method, to cope with the device becoming smaller, has attracted attention in place of the conventional sputtering method. With regard to tungsten as a wiring material, a thermal CVD method has attracted particular attention in which a tungsten film is deposited (a blanket tungsten film, hereinafter referred to as a "B-W film") on the entire surface of the substrate by chemical reaction between tungsten hexafluoride ($WF_6$) gas and $H_2$ gas.

In the thermal CVD method for a B-W film, a satisfactory step coverage characteristic can be achieved in a hole having a diameter of 0.5 μm or less and an aspect ratio of 2 or more. The thermal CVD method for the B-W film meets the demand for planarization within the device and prevention of electromigration.

The conventional basic construction of a B-W film thermal CVD apparatus will be briefly described below.

A reaction gas supply plate for supplying reaction gas is provided in an upper portion of a reactor, and a substrate holder on which a substrate is mounted is provided in a lower portion of the reactor. The substrate holder is heated by a heater. The temperature of the substrate holder is measured by a thermocouple buried inside the substrate holder.

A hole connected to a pressure differential chuck exhaust section is provided in the central portion of the substrate holder. A pressure-differential groove which connects to the above-mentioned hole is formed on the surface of the substrate holder where the substrate is mounted. After the substrate is mounted on the mounting surface, the hole and the pressure differential groove are evacuated by the pressure differential chuck exhaust section. The substrate is chucked onto the substrate holder by the pressure difference between the obverse and reverse surfaces of the substrate. It is also possible to chuck the substrate by an electrostatic chuck in place of the pressure differential chuck.

In addition, a supply passage, which is provided inside and around the substrate holder, for supplying purge gas, for example, argon gas, is formed. Making purge gas eject below or around the substrate prevents the reaction gas from entering the reverse side of the substrate and around the substrate holder, thereby preventing any unwanted film from being deposited on the reverse side of the substrate and on the substrate holder.

In the B-W film thermal CVD apparatus, a B-W film is deposited on the entire surface of the substrate as a result of a chemical reaction of the above-mentioned mixture gas supplied from the reaction gas supply plate on the surface of the substrate heated via the holder. The typical film deposition conditions for a B-W film are as follows in the initial nucleus formation stage: reaction gas $WF_6$:2 to 10 sccm, $SiH_4$:2 to 10 sccm, purge gas Ar: 100 to 500 sccm, temperature of the substrate holder: 400° to 500° C., and pressure: 0.5 to 10 Torr. Then, in the film deposition stage by the reduction of $H_2$, the typical film deposition conditions for a B-W film are reaction gas $WF_6$: 100 to 200 sccm, $H_2$: 1000 to 2000 sccm, purge gas Ar: 300 to 1000 sccm, temperature of the substrate holder: 400° to 500° C., and the pressure: 30 to 70 Torr.

A conventional Ti film CVD apparatus is a parallel plate-type plasma enhanced CVD apparatus (PECVD apparatus) for generating a plasma between a reaction gas supply plate and a substrate holder by applying RF power to the reaction gas supply plate via a current introduction terminal. The Ti film PECVD apparatus comprises other CVD hardware similar to that of the above-mentioned B-W film thermal CVD apparatus, for example, a reaction gas supply plate, a substrate holder, a purge gas supply passage, a heater for heating the substrate holder, and a pressure differential chuck mechanism or electrostatic chuck mechanism inside a reactor.

The typical film deposition conditions of such Ti film PECVD apparatus are: reaction gas $TiCl_4$: 1 to 50 sccm, $H_2$: 20 to 2000 sccm, purge gas Ar: 300 to 1000 sccm, temperature of the substrate holder: 400° to 600° C., pressure: 0.1 to 10 Torr, and RF power: 100 to 600 W.

In the conventional B-W film thermal CVD apparatus, since the substrate holder is away from the reaction gas supply plate, the ratio of reaction gas which is evacuated without reaching the substrate is high. The B-W film thermal CVD apparatus has a problem in that the ratio of the reaction gas which is consumed for film deposition in relation to the total amount of the supplied reaction gas, i.e., the reaction gas use efficiency, is low.

One method of solving the above-described problem includes making the spacing between the substrate holder and the reaction gas supply plate narrow. In this method, the reaction gas supply plate is heated by the heat of the substrate holder, and a film is made to build up on the reaction gas supply plate. The film deposition on the reaction gas supply plate causes dust particles to accumulate. Since the dust particles contaminate the semiconductor device being manufactured, the yield of the semiconductor device decreases.

Another method of solving the problem of the low reaction gas use efficiency includes rotating the substrate and the substrate holder. However, this method causes a problem in that, since a waiting period is required (20 sec. up to 1000 rpm) for stabilizing the reaction gas flow of the surrounding of the substrate holder in correlation with the rotation, productivity is reduced.

Further, in addition to the above-described problem, the conventional Ti film PECVD apparatus has a problem in that since the substrate holder is away from the reaction gas supply plate, the plasma density is likely to decrease. Low plasma density retards film deposition. In addition, low plasma density deteriorates film quality because a large quantity of unreacted gas and the residue of a byproduct in the film are generated.

A method of solving the above-described problem of the conventional Ti film PECVD apparatus includes using a high-density plasma source, for example, electron cyclotron resonance (ECR). However, an apparatus having a high-density plasma source incorporated therein generally becomes enlarged.

OBJECTS AND SUMMARY

It is an object of the present invention to solve the above-described problems and to provide a CVD apparatus for performing film deposition with a high degree of reaction gas use efficiency.

It is another object of the present invention to provide a CVD apparatus which achieves high productivity and high yield without becoming enlarged.

The present invention is directed to a CVD apparatus that satisfies the needs identified in the Background section. A preferred embodiment of a CVD apparatus having the features of the present invention comprises a reactor, a substrate holder provided inside the reactor, and a reaction gas supply plate, disposed facing the substrate holder, for supplying reaction gas into the reactor. The reaction gas supply plate comprises at least two cylinders disposed concentrically with said substrate-facing surface. In order to increase the reaction gas use efficiency, the reaction gas supply plate supplies reaction gas from each cylinder.

The embodiment of the CVD apparatus of the present invention is provided with a reaction gas supply plate and a power supply apparatus for supplying electric power to the substrate holder in order to generate a plasma.

In the embodiment of the CVD apparatus of the present invention, ring magnets are provided in the upper and lower portions of the reactor. In order to generate a high-density plasma, each magnet in the upper and lower portions of the reactor generates magnetic lines of force passing through a plasma space.

The embodiment of the CVD apparatus of the present invention is provided with another magnet of a cylinder type at the center of the upper ring magnet. Magnetic lines of force are generated for generating a high-density plasma between the upper ring magnet and the cylinder type magnet.

The embodiment of the CVD apparatus of the present invention is provided with a coil for supplying RF power around the outer-side cylinder in order to generate an induction coupled-type plasma.

The embodiment of the CVD apparatus of the present invention is provided with a power supply system for supplying electric power to the substrate holder in order to apply a bias voltage to the substrate.

The embodiment of the CVD apparatus of the present invention is provided with ring magnets in the upper and lower portions of the reactor in order to generate magnetic lines of force passing through the induction coupled type plasma.

The embodiment of the CVD apparatus of the present invention is provided with a cylinder type magnet at the center of the upper ring magnet so that magnetic lines of force are generated between the upper ring magnet and the cylinder type magnet.

The embodiment of the CVD apparatus of the present invention comprises a movement mechanism for moving the substrate holder so as to be able to set the spacing between the substrate holder and the reaction gas supply plate.

In the embodiment of the CVD apparatus of the present invention, reaction gas is introduced from each space of two cylinders provided concentrically with the facing side of the reaction gas supply plate disposed so as to face the substrate holder. As a result, the reaction gas to be supplied into the reactor is efficiently used.

In the embodiment of the present invention, a high-density plasma is generated between the reaction gas supply plate to which required electric power is supplied and the substrate holder. Further, the magnetic lines of force generated in the plasma region by the magnets disposed in the upper and lower portions of the reactor increase the plasma density in the plasma space even more.

In addition, in the embodiment of the present invention, by using the coil disposed around the outer-side cylinder and to which coil RF current is supplied, plasma density in the plasma space is increased even more.

The above and further objects, aspects and novel features of the invention will becomes more apparent from the following detailed description when read in connection with the accompanying drawings.

DESCRIPTION OF THE PREFERRED EMBODIMENTS

Preferred embodiments of the present invention will be described below with reference to the accompanying drawings.

Figure 1:
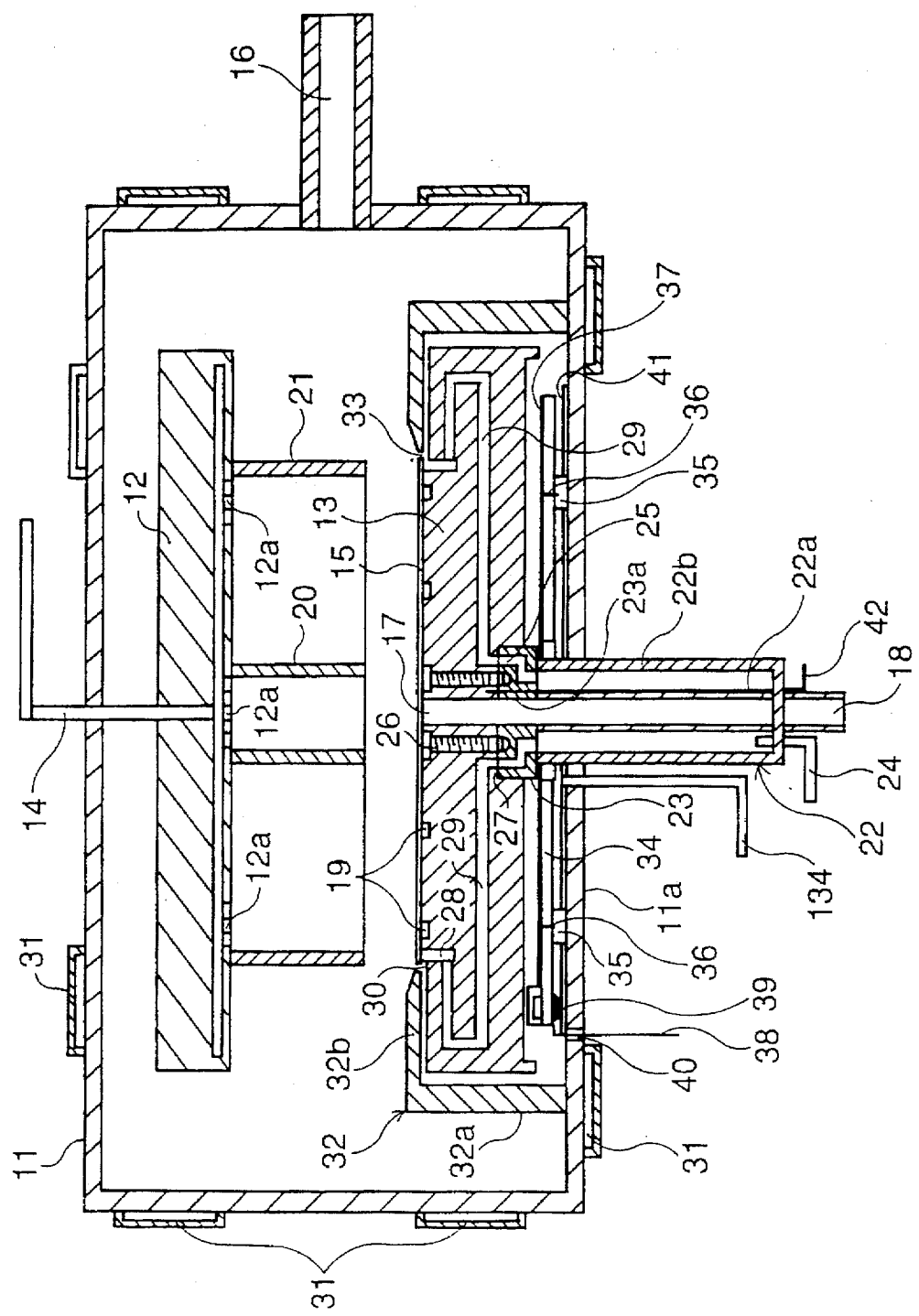
FIG. 1 is a longitudinal sectional view of a first preferred embodiment of a CVD apparatus of the present invention.

Referring to FIG. 1, a first preferred embodiment of a B-W film thermal CVD apparatus of the present invention will be described. In this thermal CVD apparatus, a reaction gas supply plate 12 is provided in the upper portion of a reactor 11, and a substrate holder 13 is provided in the lower portion of the reactor 11. The substrate holder 13 is made of aluminum, and a substrate 15 is placed on the top surface of the substrate holder 13. The planar shape of the substrate holder 13 is circular.

Figure 2:
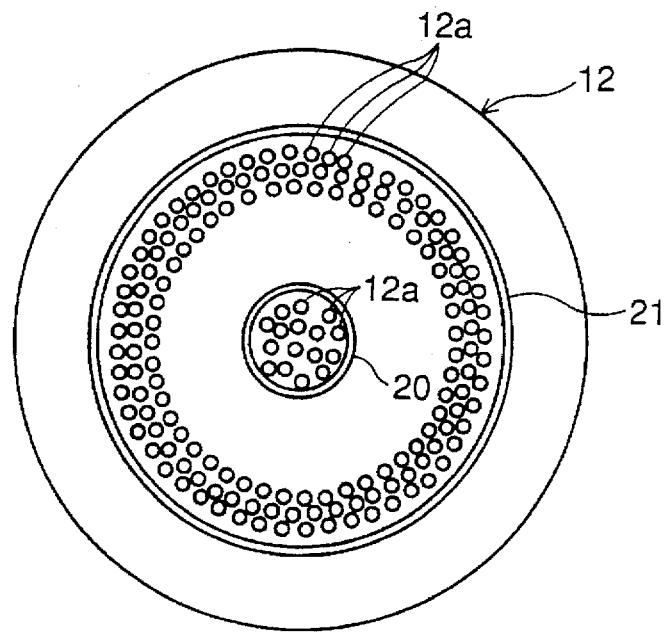
FIG. 2 is a bottom view of a reaction gas supply plate of FIG. 1.

Provided on the bottom of the reaction gas supply plate 12 for supplying reaction gas are a plurality of gas ejection holes 12a. The reaction gas supplied through a gas supply pipe 14 is made to eject from the gas ejection holes 12a on the bottom of the reaction gas supply plate 12 and is introduced into the reactor 11. The bottom of the reaction gas supply plate 12 faces the substrate 15 placed on the substrate holder 13. Provided on the bottom of the reaction gas supply plate 12 are a first cylinder 20 having a small diameter and a second cylinder 21 having a large diameter, which are disposed concentrically with each other. The dimensions of the first cylinder 20 are: an outer diameter of 28 mm, a length of 36 mm, and a thickness of 1.5 mm. The dimensions of the second cylinder 21 are: an outer diameter of 150 mm, a length of 36 mm, and a thickness of 2 mm. The outer diameter of the second cylinder 21 is substantially the same as the diameter of the substrate. The cylinders 20 and 21 extend to near the processing surface of the substrate 15. Although the axial lengths of the cylinders 20 and 21 are substantially the same as shown in the figure, the axial lengths may be different. The gas ejection holes 12a, as shown in FIGS. 1 and 2, are provided within the cylinder 20, and between the cylinder 20 and the cylinder 21. The holes 12a have a diameter of approximately 0.5 mm, and are formed at pitches of approximately 5 mm in two regions on the bottom of the reaction gas supply plate 12. In one region, the holes 12a are formed on the entire area of the bottom of the reaction gas supply plate 12. In the other region, the holes 12a are formed on the bottom between the cylinders 20 and 21 in a ring shape along the inner edge of the cylinder 21 in the range of 60 to 75 mm from the center of the reaction gas supply plate 12. A B-W thin film is deposited on the surface of the substrate 15 by the reaction gas supplied from the reaction gas supply plate 12. The unreacted gas and byproduct gas produced inside the reactor 11 are evacuated by an evacuation section 16.

The spacing between the lower end of each of the cylinders 20 and 21 and the surface of the substrate 15 is 15 mm. The spacing is the minimum spacing necessary for inserting an arm of a transfer robot for mounting a substrate on the substrate holder 13.

By a double cylinder constituted of the cylinders 20 and 21, the gas ejection holes 12a formed in the two regions of the reaction gas supply plate 12, and the minimum necessary spacing between the double cylinder and the substrate, the reaction gas generated from the reaction gas supply plate 12 can be introduced so that the reaction gas is concentrated near the substrate 15. Such construction increases the reaction gas use efficiency. Two cylinders of a shape other than a circle, from a sectional view, are possible in place of the cylinders 20 and 21.

Provided in the central portion of the substrate holder 13 is a hole 17 which opens therethrough vertically. This through hole 17 is connected to a pressure-differential chuck evacuation section 18 in the lower portion, which is separate from the evacuation section 16 attached to the reactor 11. The through hole 17 is connected to pressure differential grooves 19, having a depth of 1 mm and a width of 1.5 mm, provided on the top surface of the substrate holder 13. The pressure differential grooves 19 are formed with eight (8) straight grooves (not shown) in a radial form which extend in a radial direction, and two circumferential grooves provided concentrically. After the substrate 15 is mounted on the top surface of the substrate holder 13, the pressure differential groove 19 is evacuated to a vacuum by the pressure differential chuck evacuation section 18. A pressure difference occurs between the top surface of the substrate 15 and the pressure differential groove 19. The substrate 15 is chucked onto the substrate holder 13 by the pressure difference. Such substrate chuck means is usually called a pressure differential chuck or a vacuum chuck. This pressure differential chuck makes it possible to deposit a film on the entire surface of the substrate 15 without mechanical contact with the surface of the substrate 15 on which film deposition is performed. As chuck means, an electrostatic chuck may be also used.

According to this pressure differential chuck, since there is no mechanical contact with the film deposition surface of the substrate 15, the distribution of temperature of the surface of the substrate 15 is determined only by the contact state between the substrate 15 and the substrate holder 13. Because the substrate 15 is uniformly chucked onto the substrate holder 13 and the temperature distribution of the substrate holder 13 is uniform, a uniform temperature distribution is achieved on the substrate 15.

A cylinder 22 having its lower surface closed and having a connector 23 chucked onto its upper surface is mounted on a lower wall 11a of the reactor 11. The cylinder 22 holds the substrate holder 13. The cylinder 22 is formed with an inner cylindrical section 22a and an outer cylindrical section 22b. The inner cylindrical section 22a of the cylinder 22 is formed with a hole which connects to the hole 17 and extends outside from the lower wall of the cylinder 22. Purge gas (first purge gas) is supplied through a purge gas introduction section 24 into the space between the outer cylindrical section 22b and the inner cylindrical section 22a of the cylinder 22. The connector 23 has formed in its central portion a hole 23a which connects to the hole 17 and a hole inside the inner cylindrical section 22a, and ten (10) purge gas supply passages 25 are formed around the connector 23.

The substrate holder 13 is chucked to the connector 23 by screws 26 and mounted on the cylinder 22. The substrate holder 13, while being supported by the cylinder 22, is disposed substantially horizontally in the central portion of the lower portion of the reactor 11. The substrate holder 13, the connector 23, and the cylinder 22 are formed integrally. With this construction, the hole 17 of the pressure differential chuck, the purge gas supply passages 25, and the internal space of the reactor 11 are separated from each other. A sealing member 27 is provided on the contact surface between the connector 23 and the substrate holder 13 in order to prevent purge gas from leaking outside the passage.

A circular purge gas ejection groove 28 is formed on the top surface of the substrate holder 13, and ten (10) purge gas passages 29 are formed inside the substrate holder 13. Each of the ten (10) purge gas passages 29 connect the corresponding purge gas supply passage 25 in the connector 23 to the purge gas ejection groove 28 formed on the top surface of the substrate holder 13. Each purge gas passage 29 supplies a first purge gas introduced by the purge gas introduction section 24 to the purge gas ejection groove 28. Each purge gas passage 29 is formed with a horizontal radial section extending in the radial direction of the substrate holder 13 and a vertical axial section extending in the axial direction of the substrate holder 13. The radial sections of each purge gas passages 29 are disposed at positions in a radial form at intervals of equal angles. The radial section of the purge gas passage 29 includes a first radial section having a length greater than the radius of the outer wall of the circular purge gas ejection groove 28 in the lower portion in FIG. 1, and a second radial section such that a purge gas ejection opening (outlet portion) is formed on the outer wall of the purge gas ejection groove 28 in the upper portion in FIG. 1. The purge gas passage 29 extends along the radial direction so as to become longer than the radius of the purge gas ejection groove 28 as a whole. Further, the purge gas passage 29 is folded toward the central portion of the substrate holder 13 via the vertical axial section and is connected to the purge gas ejection groove 28 from outside the purge gas ejection groove 28.

The purge gas passage 29 formed inside the substrate holder 13, in practice, has the hole of the radial section connected to the hole of the axial section opened from the outer surface of the substrate holder 13. The opening section of each hole of the radial section and the axial section is closed by a stopper.

On the top surface of the substrate holder 13, a step difference, 0.2 mm in depth, is provided between the substrate placement surface inward of the purge gas ejection groove 28 and the outer surface of the purge gas ejection groove 28. This step difference, when the substrate 15 is placed on the substrate placement surface, forms an interstitial space 30 for making purge gas eject between the substrate 15 and the substrate holder 13.

A plurality of water cooling passages 31 for cooling the reactor 11 are provided on the outer surface of the reactor 11.

Further, a shielding member 32 is provided around the substrate holder 13. This shielding member 32 is formed with a cylindrical section 32a around the side of the substrate holder 13 and a ring plate section 32b adjacent the periphery of the substrate on the top surface of the substrate holder 13. The cylindrical section 32a of the shielding member 32 is chucked to the lower wall 11a of the reactor 11. The interstitial space between the ring plate section 32b and the substrate holder 13 is approximately 1 mm at room temperature. However, when the substrate holder 13 is heated during film deposition, the substrate holder 13 is thermally expanded, and the interstitial space becomes approximately 0.2 mm. This interstitial space is nearly equal to the above-mentioned interstitial space 30 formed between the substrate 15 and the substrate holder 13. Therefore, the inner edge of the ring plate section 32b becomes substantially the same height as that of the outer edge of the substrate 15. Further, an interstitial space 33 of approximately 1 mm is formed between the inner edge of the ring plate section 32b and the outer edge of the substrate 15.

The interstitial space between the shielding member 32 and the substrate holder 13 becomes a supply passage for making a second purge gas introduced by the purge gas introduction section 134 flow. The second purge gas is mainly used to prevent film deposition onto the substrate holder 13. The second purge gas is made to eject through an interstitial space between the ring plate section 32b and the substrate holder 13, and through the interstitial space 33 between the inner edge of the ring plate section 32b and the outer edge of the substrate 15.

The second purge gas merges near the interstitial space 33 with the first purge gas flowing through the purge gas passages 29 of the substrate holder 13 and the purge gas ejection groove 28, and ejects into the interior of the reactor 11. In this case, by the merging effect of the first purge gas near the interstitial space 33, the second purge gas ejects at nearly right angles to the surface of the substrate holder 13 or the substrate 15. The ejection of the second purge gas prevents the reaction gas from entering the interstitial space between the substrate holder 13 and the shielding member 32. On the other hand, the first purge gas ejecting from the interstitial space 30 prevents the reaction gas from entering the reverse side of the substrate 15. Further, the merged purge gas causes the concentration of the reaction gas from above to near the interstitial space 33 to be diluted.

The substrate holder 13 holds the substrate 15 while heating it by thermal conduction effect. The substrate holder 13 is heated by the radiant heat of a ceramic heater 34 in a ring plate shape disposed between the substrate holder 13 and the lower wall 11a of the reactor 11. The ceramic heater 34 is disposed inside the passage through which purge gas is supplied inside the reactor 11.

The ceramic heater 34 is chucked onto at least three support sections 35 made of ceramic by using ceramic screws 36. A carbon coating section 37 is provided on the top surface of the ceramic heater 34. The carbon coating section 37 generates heat when electric current is supplied thereto via a conducting wire 38 from outside and a wiring chuck screw 39. The conducting wire 38 is wired via a sealing section 40. Since the ceramic heater 34 and the substrate holder 13 are disposed close to each other, heating efficiency is very satisfactory. A reflection plate 41 made of tantalum (Ta) is disposed below the ceramic heater 34.

The temperature of the substrate holder 13 is measured by a thermocouple 42 located inside the substrate holder 13. Thereafter, the measured data is referenced by a heating control system (not shown) in order to control the temperature of the substrate holder 13.

Film deposition takes place after the substrate 15, for example, a semiconductor wafer having a diameter of 150 mm, is chucked by a pressure differential chuck onto the substrate holder 13 which is set at a predetermined temperature by the ceramic heater 34, and then reaction gas is introduced from the reaction gas supply plate 12. The unreacted gas and the byproduct gas are evacuated from the evacuation section 16. The first and second purge gases are introduced to prevent an unwanted film from being deposited on the reverse side of the substrate 15 and the substrate holder 13 during film deposition.

The typical B-W film deposition conditions of the CVD apparatus of this embodiment are as follows in the initial nucleus formation stage: reaction gas $WF_6$: 2 to 10 sccm, $SiH_4$: 2 to 10 sccm, purge gas (Ar): 100 to 500 sccm, temperature of the substrate holder 13: 400° to 500° C., and pressure: 0.5 to 10 Torr. In the film deposition stage, by the reduction of $H_2$, the typical B-W film deposition conditions of the CVD apparatus of this embodiment are: reaction gas $WF_6$: 50 to 200 sccm, $H_2$: 500 to 2000 sccm, purge gas: 300 to 1000 sccm, temperature of the substrate holder 13: 400° to 500° C., and pressure: 30 to 70 Torr.

Under the conditions of, in particular, $WF_6$: 50 sccm, $H_2$: 1000 sccm, temperature of the substrate holder: 440° C., and pressure: 40 Torr, satisfactory results can be obtained such that the film deposition rate is 0.5 μm/min., and the standard deviation of the distribution (the measuring region: 140 mmφ) within the substrate surface is ±2.7%.

On the other hand, under the conditions of $WF_6$: 100 sccm, $H_2$: 1000 sccm, temperature of the substrate holder: 440° C., and pressure: 40 Torr, results can be obtained such that the film deposition rate is 0.3 μm/min. in the conventional apparatus, and the standard deviation of the distribution (the measuring region: 140 mmφ) within the substrate surface is ±9%.

In the CVD apparatus of this embodiment during B-W film deposition, reaction gas use efficiency is 42%. The CVD apparatus of this embodiment has considerably improved reaction gas use efficiency in comparison with the reaction gas use efficiency of 13% in the conventional apparatus.

Figure 5:
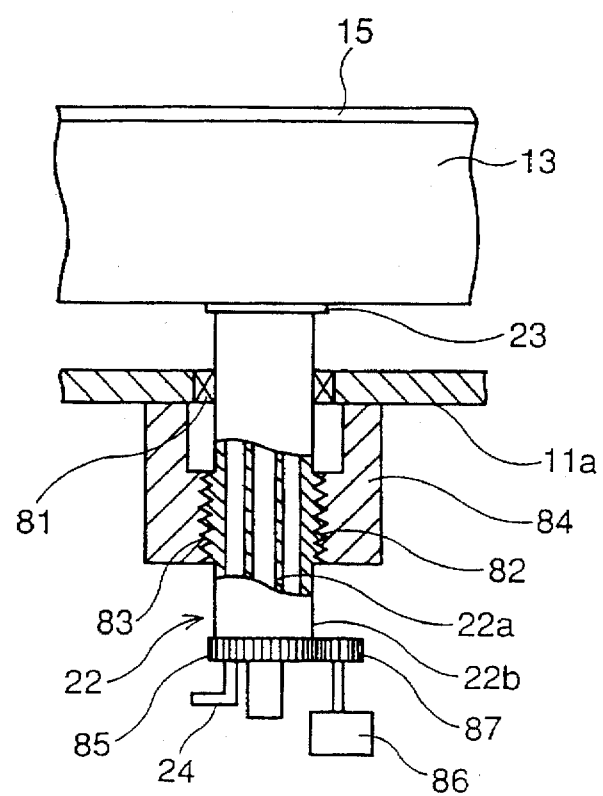
FIG. 5 is a partly cut-away, side view of a movement mechanism.

In a modification of the first embodiment, a movement mechanism adapted to make it possible to cause the substrate holder 13 to move vertically is provided, as shown in FIG. 5, in addition to the above-described construction of the first embodiment. This movement mechanism moves up and down when the cylinder 22 moves up and down by the hole of the lower wall 11a of the reactor 11 via a hermetically sealing ring 81. The cylinder 22 is mounted on the lower wall 11a of the reactor 11 as a result of the threaded connection of a support member 84 having a male screw part 82 formed on the outer surface of the cylinder 22 and a female screw part 83 mounted on the outside of the lower wall 11a of the reactor 11. The cylinder 22 is provided with a gear 85 in the lower portion of the cylinder 22. The gear 85 meshes with a gear 87 provided on the output shaft of a motor 86.

The movement mechanism makes the substrate holder 13 move up and down by making the cylinder 22 move up and down while rotating by the threaded connection part when the motor 86 is rotationally driven.

The spacing between the surface of the substrate 15 and the top end of the cylinders 20 and 21 is made to be 1 mm by the movement mechanism, and the same film deposition as that described above is performed. As a result, satisfactory results can be obtained such that the film deposition rate is 0.7 µm/min., and the standard deviation of the distribution (the measuring region: 140 mmφ) within the substrate surface is ±2.5%. Reaction gas use efficiency is 60%. In FIG. 5, the illustration of the ceramic heater is omitted.

Although this embodiment describes an example of the B-W film CVD apparatus, the present invention can be applied to other CVD apparatuses, for example, TiN, Cu, or Al film CVD apparatuses.

As another advantage of the above-described embodiment, the outer-side second cylinder 21 prevents the purge gas supplied from the side of the substrate holder 13 from reaching the surface of the substrate 15. Such suppression makes it possible to limit a decrease in the film deposition rate in the periphery of the substrate, and therefore, satisfactory distribution within the substrate surface can be obtained.

Next, a second preferred embodiment of a CVD apparatus of the present invention will be described with reference to FIG. 3.

In this embodiment, a parallel plate-type Ti film PECVD apparatus will be described. The components in FIG. 3 which are substantially the same as those shown in FIG. 1 are given the same reference numerals, and a detailed explanation thereof is omitted. The construction, operation, and advantages which are the features of the second embodiment and different from those of the apparatus of the first embodiment will be described below.

A conducting wire 52 inserted via a current introduction terminal 51 provided on the top wall of the reactor 11 is connected to the reaction gas supply plate 12. The conducting wire 52 is connected at its outer-side end to the RF power supply. The conducting wire 52 supplies RF current for generating a high density plasma between the reaction gas supply plate 12 and the substrate 15.

Provided on the outer side of the top wall of the reactor 11 are a ring magnet 53 having an outer diameter of 155 mm and an inner diameter of 135 mm, whose bottom surface is an N pole, and a cylindrical magnet 54 having an outer diameter of 20 mm, whose bottom surface is an S pole. Provided on the bottom wall of the reactor 11 are a ring magnet 55 having an outer diameter of 155 mm and an inner diameter of 145 mm, whose top surface is an S pole. These magnets 53, 54, and 55 interact with each other and generate magnetic lines of force in the plasma. The generation of such magnetic lines of force causes the electrons in the plasma to move in a spiral along the magnetic lines of force. The spiral movement of the electrons causes the movement distance of the electrons to be longer than a case in which the electrons move straight, and therefore increases the incidence of collision with the gas particles in the plasma. The increase in the incidence of collision with the gas particles causes the density of the plasma between the reaction gas supply plate 12 and the substrate 15 to be increased even more. As a result, the film deposition rate on the surface of the substrate 15 is increased.

In the CVD apparatus of the second embodiment, an electrostatic chuck is used as means for chucking the substrate 15 placed on the substrate holder 13. A cylinder 56 for holding the substrate holder 13 is provided with a purge gas introduction section 24 for introducing a first purge gas.

A shielding member 57 placed around the substrate holder 13 is provided on the lower wall of the reactor 11 via an insulator 58, and a ring member 59 is further provided around the shielding member 57. Connected to the substrate holder 13 and the shielding member 57 is a conducting wire 61 inserted via a current introduction terminal 62 provided on the lower wall of the reactor 11. The conducting wire 61 is connected at its outer-side terminal to the RF power supply. The conducting wire 52 supplies RF current to the reaction gas supply plate 12 for the purpose of plasma discharge, whereas the conducting wire 61 applies a bias voltage to the substrate 15 and the shielding member 57.

By supplying required electric power to each of the reaction gas supply plate 12, the substrate holder 13, the substrate 15, and the shielding member 57 as described above, a high density plasma is generated. Further, the density of the plasma is increased even more by the magnets 53, 54, and 55.

Figure 3:
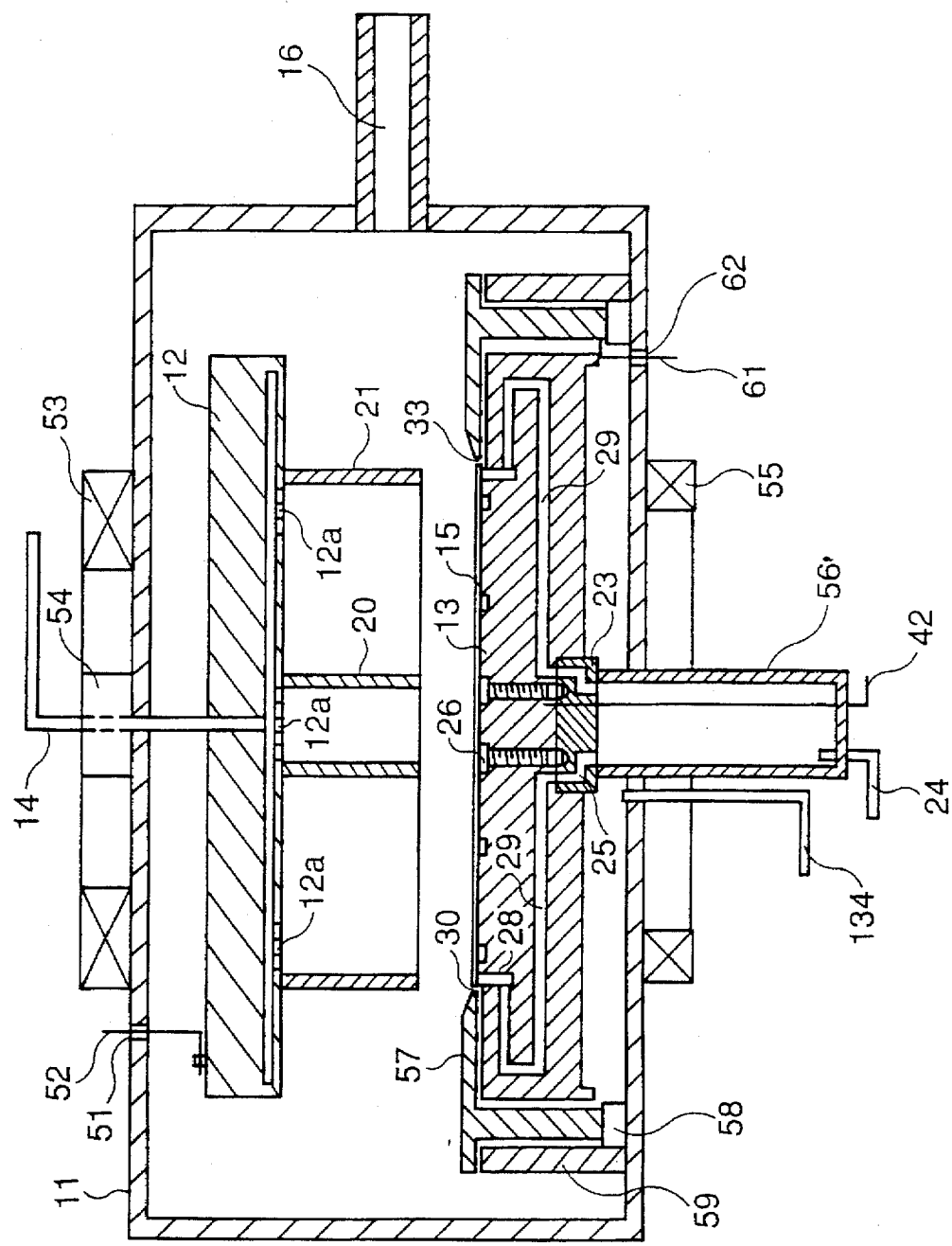
FIG. 3 is a longitudinal sectional view of a second preferred embodiment of a CVD apparatus of the present invention.

In FIG. 3, the illustration of a heating mechanism for heating the substrate holder 13 and the water cooling passage is omitted. The other construction is the same as that of the apparatus of the first embodiment. The heating mechanism may be provided inside the substrate holder 13. In particular, the following construction is a main feature of the second embodiment as in the case of the first embodiment in that the first cylinder 20 and the second cylinder 21 placed concentrically on the bottom of the reaction gas supply plate 12 are provided, and gas ejection holes 12a are provided between the cylinders 20 and 21.

The typical Ti film deposition conditions of the PECVD apparatus of the second embodiment are as follows: reaction gas $TiCl_4$: 1 to 50 sccm, $H_2$: 20 to 2000 sccm, purge gas (Ar): 300 to 1000 sccm, temperature of the substrate holder: 400° to 600° C., and pressure: 0.1 to 10 Torr. 100 to 600 W of power at a frequency of 60 MHz is supplied to the reaction gas supply plate 12. Since the frequency is made to be as high as 60 MHz, the amplitude of the oscillating electrons in the plasma becomes small, and the electrons' collision with the wall of the reactor is reduced. As a result, the incidence of collision with the particles in the plasma increases; therefore, the plasma density increases, and the film deposition rate increases. 10 to 200 W of power at a frequency of 13.56 MHz is supplied to the substrate holder 13. It is possible that the supply of electric power to the reaction gas supply plate 12 and the substrate holder 13 are interchanged with each other, or one of the reaction gas supply plate 12 and the substrate holder 13 is grounded without supplying electric power thereto.

In the Ti film PECVD apparatus of the second embodiment, in particular, a film deposition rate of 10 nm/min. can be achieved under the following conditions: $TiCl_4$: 2 sccm, $H_2$: 60 sccm, temperature of the substrate holder: 600° C., pressure: 1 Torr, power to the reaction gas supply plate 12: 600 W at 60 MHz, and the substrate holder 13: grounded.

On the other hand, in the conventional Ti film PECVD apparatus, no Ti film is deposited on the substrate in spite of the fact that film deposition is performed for two hours under the following conditions: $TiCl_4$: 2 sccm, $H_2$: 60 sccm, temperature of the substrate holder: 600° C., pressure: 1 Torr, and power to the substrate holder 13: 600 W at 13.56 MHz.

Also in the second embodiment, in the same way as in the first embodiment, it is possible to make the substrate holder move up and down by the movement mechanism in order to vary the spacing between the surface of the substrate 15 and the top end of the cylinders 20 and 21. When the spacing is made to be 1 mm, a film deposition rate of 15 nm/min. can be obtained.

Figure 4:
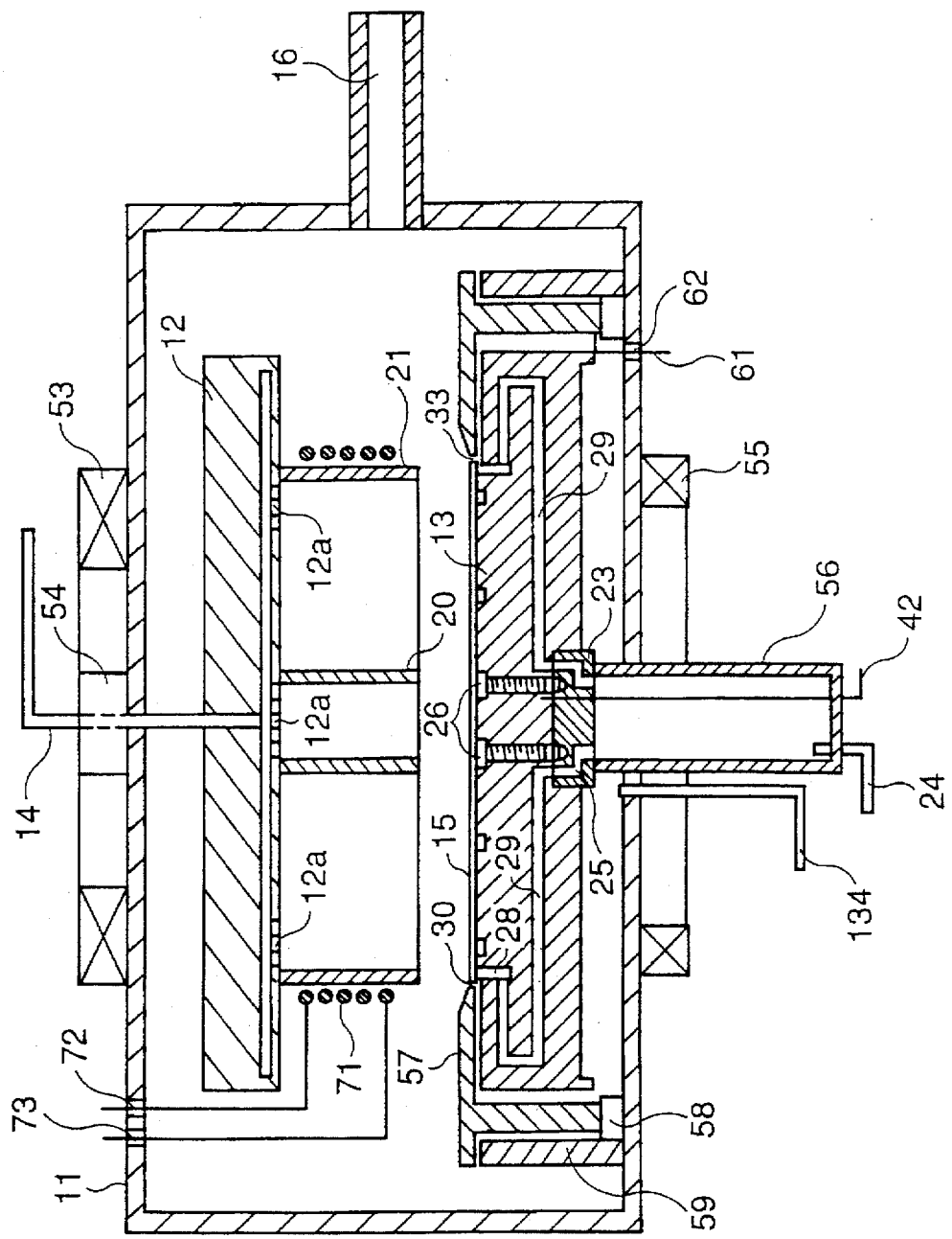
FIG. 4 is a longitudinal sectional view of a third preferred embodiment of a CVD apparatus of the present invention.

Next, a third embodiment of a Ti film PECVD apparatus of the present invention will be described with reference to FIG. 4. The PECVD apparatus of this embodiment is an induction coupled-type PECVD apparatus. The components in FIG. 4 which are substantially the same as those shown in FIG. 1 or 3 are given the same reference numerals, and a detailed explanation thereof is omitted.

In the PECVD apparatus of the third embodiment, in order to increase the density of the plasma generated between the reaction gas supply plate 12 and the substrate holder 13, a coil 71 is wound around the second cylinder 21. The coil 71 is extended outside via current introduction terminals 72 and 73 provided on the top wall of the reactor 11. The components shown in the second embodiment for supplying electric current to the reaction gas supply plate 12 are not provided. The other elements of construction and operation are the same as those described in the second embodiment.

The number of turns of the coil 71 may be one or more.

The conditions for film deposition are basically the same as those described in the second embodiment except that 100 to 600 W of power at a frequency of 13.56 MHz is supplied to the coil 71.

In the Ti film PECVD apparatus of the third embodiment, in particular, a film deposition rate of 10 nm/min. can be obtained under the following conditions: $TiCl_4$: 2 sccm, $H_2$: 60 sccm, temperature of the substrate holder: 600° C., pressure: 0.5 Torr, power to the coil 71: 600 W, and the substrate holder 13: grounded.

On the other hand, in the conventional Ti film PECVD apparatus, no Ti film is deposited on the substrate in spite of the fact that film deposition is performed for two hours under the following conditions: $TiCl_4$: 2 sccm, $H_2$: 60 sccm, temperature of the substrate holder: 600° C., pressure: 0.5 Torr, and power to the reaction gas supply plate 12: 600 W at 13.56 MHz.

Also in the third embodiment, in the same way as in the first embodiment, it is possible to make the substrate holder move up and down by the movement mechanism in order to vary the spacing between the surface of the substrate 15 and the top end of the cylinders 20 and 21. When the spacing is made to be 1 mm, a film deposition rate of 15 nm/min. can be obtained.

As is clear from the above description, according to the present invention the following advantages can be achieved.

A pair of inner and outer cylinders placed in a concentric form on the substrate-facing surface of a reaction gas supply plate are provided in a CVD apparatus. Since the internal spaces of these two cylinders are used to guide reaction gas and introduce it to the substrate, the reaction gas can be used efficiently. Since CVD reaction having a high reaction gas use efficiency can be performed, it is possible to achieve high productivity and high yield in the CVD apparatus.

The present invention is provided with a construction for varying the spacing between a cylinder and a substrate. Since an optimum spacing can be set, the use efficiency of the reaction gas can be made to correspond to each CVD apparatus.

By supplying the necessary power to a reaction gas supply plate and a substrate holder, a plasma having a high density is generated. The high density plasma makes it possible to realize a CVD apparatus having high productivity and high yield. Further, an arbitrary number of magnets in a predetermined shape are disposed in the upper and lower portions of a reactor so that magnetic lines of force pass through the plasma space within the reactor. The placement of these magnets increases the plasma density even more, and, as a result, productivity and yield are improved.

A coil to which RF current is supplied is provided around the reaction gas supply plate and the outer-side cylinder provided on the substrate-facing surface. The coil to which RF current is supplied increases the density of the generated plasma still further. Also, a construction for supplying necessary power to a substrate holder, or a construction in which an arbitrary number of magnets in a predetermined shape are disposed in the upper and lower portions of a reactor, are combined. The combination of these constructions increases the plasma density even more and, as a result, a CVD apparatus having high productivity and high yield can be realized.

Many different embodiments of the present invention may be constructed without departing from the spirit and scope of the present invention. It should be understood that the present invention is not limited to the specific embodiments described in this specification. To the contrary, the present invention is intended to cover various modifications and equivalent arrangements included within the spirit and scope of the invention as hereafter claimed. The scope of the following claims is to be accorded the broadest interpretation so as to encompass all such modifications, equivalent structures and functions.

What is claimed is:

1. A CVD apparatus comprising:

a reactor, a substrate holder provided inside said reactor, reaction gas supply means, disposed so as to face said substrate holder, for supplying reaction gas into said reactor, and two cylinders disposed in a concentric form on a substrate-facing surface of said reaction gas supply means so that said reaction gas is supplied from each of said cylinders on said reaction gas supply means.

2. The CVD apparatus according to claim 1, further comprising power supply means for supplying power to said reaction gas supply means and said substrate holder.

3. The CVD apparatus according to claim 2, further comprising ring magnets disposed in upper and lower portions of said reactor so that magnetic lines of force passing through the plasma space are generated by the magnetic pole parts of said ring magnets disposed in the upper and lower portions of the reactor.

4. The CVD apparatus according to claim 3, further comprising a cylindrical magnet provided in a central portion of said ring magnet disposed in the upper portion of the reactor, and magnetic lines of force are generated between a reactor-side magnetic pole part of said ring magnet in the upper portion of the reactor and a reactor-side magnetic pole part of said cylindrical magnet.

5. The CVD apparatus according to claim 1, further comprising a coil disposed around an outermost of the two cylinders, and means for supplying RF power to said coil.

6. The CVD apparatus according to claim 5, further comprising power supply means for supplying power to said substrate holder.

7. The CVD apparatus according to claim 5, further comprising ring magnets provided in upper and lower portions of said reactor, and magnetic lines of force passing through a plasma space are generated by facing magnetic pole parts of said ring magnets.

8. The CVD apparatus according to claim 7, further comprising a cylindrical magnet in a central portion of the ring magnet in the upper portion of the reactor, and magnetic lines of force are generated between a reactor-side magnetic pole part of said ring magnet in the upper portion of the reactor and a reactor-side magnetic pole part of said cylindrical magnet.

9. The CVD apparatus according to claim 1, further comprising means for making said substrate holder move in order to vary a spacing between said substrate holder and said reaction gas supply means.

10. A CVD apparatus comprising:

a reactor, a substrate holder provided inside said reactor, reaction gas supply means, disposed so as to face said substrate holder for supplying reaction gas into said reactor, and a cylindrical wall disposed on a substrate-facing surface of said reaction gas supply means for directing reaction gas supplied from said reaction gas supply means to a substrate mounted on the substrate holder.

11. The CVD apparatus according to claim 10, further comprising power supply means for supplying power to said reaction gas supply means and said substrate holder.

12. The CVD apparatus according to claim 11, further comprising ring magnets disposed in upper and lower portions of said reactor so that magnetic lines of force passing through the plasma space are generated by the magnetic pole parts of said ring magnets disposed in the upper and lower portions of the reactor.

* * * * *